(12) United States Patent
Knierim et al.

(10) Patent No.: US 9,432,042 B2
(45) Date of Patent: Aug. 30, 2016

(54) TEST AND MEASUREMENT INSTRUMENT INCLUDING ASYNCHRONOUS TIME-INTERLEAVED DIGITIZER USING HARMONIC MIXING

(71) Applicant: Tektronix, Inc., Beaverton, OR (US)

(72) Inventors: Daniel G. Knierim, Beaverton, OR (US); John J. Pickerd, Hillsboro, OR (US)

(73) Assignee: TEKTRONIX, INC., Beaverton, OR (US)

( * ) Notice: Subject to any disclaimer, the term of this patent is extended or adjusted under 35 U.S.C. 154(b) by 0 days.

(21) Appl. No.: 14/229,307

(22) Filed: Mar. 28, 2014

(65) Prior Publication Data
US 2014/0354344 A1 Dec. 4, 2014

Related U.S. Application Data

(63) Continuation-in-part of application No. 13/116,234, filed on May 26, 2011, now Pat. No. 8,742,749.

(51) Int. Cl.
*H03M 1/12* (2006.01)
*G01R 23/14* (2006.01)
*G01R 13/02* (2006.01)

(52) U.S. Cl.
CPC ........... *H03M 1/121* (2013.01); *G01R 13/0272* (2013.01); *G01R 23/14* (2013.01); *H03M 1/1215* (2013.01)

(58) Field of Classification Search
CPC .......................... G01R 13/0272; H03M 1/121
USPC .................................................. 327/355, 356
See application file for complete search history.

(56) References Cited

U.S. PATENT DOCUMENTS

| 5,255,267 A | 10/1993 | Hansen et al. |
| 5,392,044 A | 2/1995 | Kotzin et al. |
| 5,568,142 A | 10/1996 | Velazquez et al. |

(Continued)

FOREIGN PATENT DOCUMENTS

| EP | 1720259 A1 | 11/2006 |
| EP | 2528235 A2 | 11/2012 |
| WO | 2004038432 | 5/2004 |

OTHER PUBLICATIONS

Extended European Search Report for related EP Application No. 12 169 732.0, mailed Mar. 6, 2013, European Patent Office, Netherlands.

(Continued)

*Primary Examiner* — William Hernandez
(74) *Attorney, Agent, or Firm* — Marger Johnson; Thomas F. Lenihan (57) ABSTRACT

A test and measurement instrument including a splitter configured to split an input signal having a particular bandwidth into a plurality of split signals, each split signal including substantially the entire bandwidth of the input signal; a plurality of harmonic mixers, each harmonic mixer configured to mix an associated split signal of the plurality of split signals with an associated harmonic signal to generate an associated mixed signal; and a plurality of digitizers, each digitizer configured to digitize a mixed signal of an associated harmonic mixer of the plurality of harmonic mixers. A first-order harmonic of at least one harmonic signal associated with the harmonic mixers is different from an effective sample rate of at least one of the digitizers.

13 Claims, 8 Drawing Sheets

(56) References Cited

U.S. PATENT DOCUMENTS

| | | | |
|---|---|---|---|
| 5,659,546 | A | 8/1997 | Elder |
| 5,668,836 | A | 9/1997 | Smith et al. |
| 5,745,846 | A * | 4/1998 | Myer et al. ............ 455/209 |
| 5,949,236 | A | 9/1999 | Franchville |
| 6,009,130 | A * | 12/1999 | Lurey et al. ............ 375/347 |
| 6,157,682 | A | 12/2000 | Oberhammer |
| 6,269,317 | B1 | 7/2001 | Schachner et al. |
| 6,380,879 | B2 | 4/2002 | Kober et al. |
| 6,771,198 | B2 | 8/2004 | Azadet |
| 6,950,048 | B1 | 9/2005 | Slavin |
| 6,980,147 | B2 | 12/2005 | Mathis et al. |
| 7,058,548 | B2 | 6/2006 | Pupalaikis et al. |
| 7,139,684 | B2 | 11/2006 | Pupalaikis et al. |
| 7,219,037 | B2 | 5/2007 | Pupalaikis et al. |
| 7,222,055 | B2 | 5/2007 | Pupalaikis et al. |
| 7,373,281 | B2 | 5/2008 | Pupalaikis et al. |
| 7,474,972 | B2 * | 1/2009 | Pickerd et al. ............ 702/75 |
| 7,519,513 | B2 | 4/2009 | Pupalaikis et al. |
| 7,653,514 | B2 | 1/2010 | Pupalaikis et al. |
| 7,701,842 | B2 | 4/2010 | Roberts et al. |
| 7,711,510 | B2 | 5/2010 | Pupalaikis |
| 8,023,402 | B2 | 9/2011 | Roberts et al. |
| 8,073,656 | B2 | 12/2011 | Pupalaikis et al. |
| 2001/0022811 | A1 | 9/2001 | Lillington |
| 2004/0128076 | A1 * | 7/2004 | Pupalaikis et al. ............ 702/16 |
| 2004/0252044 | A1 | 12/2004 | Mathis et al. |
| 2005/0239432 | A1 | 10/2005 | Wilcox |
| 2008/0231488 | A1 | 9/2008 | Pickerd et al. |
| 2009/0002213 | A1 | 1/2009 | LaMarche et al. |
| 2009/0093986 | A1 | 4/2009 | LaMarche et al. |
| 2012/0299579 | A1 | 11/2012 | Knierim |
| 2013/0093493 | A1 * | 4/2013 | Pickerd et al. ............ 327/361 |
| 2014/0285251 | A1 * | 9/2014 | Carlson ............ 327/361 |

OTHER PUBLICATIONS

Aziz, Pervez, et al., "Multi Band Sigma Delta Analog to Digital Conversion," 1994 IEEE International Conference on Acoustics, Speech and Signal Processing, vol. III, pp. 249-252, Apr. 19-22, 1994, Adelaide, South Australia.

Gangyaokuang, C., et al., "A Way of Multi-channel A/D for UWB Signal," 1995, Proceedings of the IEEE 1995 National Aerospace and Electronics Conference (NAECON 1995), vol. 1, pp. 206-209, Dayton, Ohio.

Lowenborg, P., et al, "A Design Procedure for 2-Channel Mixed Analog and Digital Filter Banks for A/D Conversion Using Minimax Optimization," Proceedings of ICECS '99, The 6th IEEE International Conference on Electronics, Circuits and Systems, vol. 3, pp. 1189-1192, Sep. 5-8, 1999, Pafos, Cyprus.

Petraglia, A., et al., "Effects of Quantization Noise in Parallel Arrays of Analog-to-Digital Converters," 1994 IEEE International Symposium on Circuits and Systems, vol. 5, pp. 337-340, May 30-Jun. 2, 1994, London, England.

Kong, S. K., et al., Frequency Domain Analysis of ΠΔΣ ADC and Its Application to Combining Subband Decomposition and ΠΔΣ ADC, IEEE 39th Midwest Symposium on Circuits and Systems, vol. 1, pp. 226-229, Aug. 18-21, 1996, Ames, Iowa.

Velazquez, S., "High-Performance Advanced Filter Bank Analog-to-Digital Converter for Universal RF Receivers," Proceedings of the IEEE-SP International Symposium on Time-Frequency and Time-Scale Analysis, pp. 229-232, Oct. 6-9, 1998, Pittsburgh, Pennsylvania.

Velazquez, S., et al. "A Hybrid Filter Bank Approach to Analog-to-Digital Conversion," Proceedings of the IEEE-SP International Symposium on Time-Frequency and Time-Scale Analysis, pp. 116-119, Oct. 25-28, 1994, Philadelphia, Pennsylvania.

Namgoong, W., "A Channelized DSSS Ultra-Wideband Receiver," Radio and Wireless Conference, 2001, IEEE, pp. 105-108, Aug. 19-22, 2001, Waltham, Massachusetts.

Extended European Search Report for European Patent Application No. 151517601.4, dated Aug. 3, 2015, 6 pages, Munich.

European Search Report and Written Opinion for EP application No. 151612702, dated Sep. 7, 2015, 7 pages.

* cited by examiner

TEST AND MEASUREMENT INSTRUMENT INCLUDING ASYNCHRONOUS TIME-INTERLEAVED DIGITIZER USING HARMONIC MIXING

BACKGROUND

This invention relates to test and measurement instruments and, more particularly, to test and measurement instruments including one or more asynchronous time-interleaved digitizers, which use harmonic mixing for reducing noise.

Useable bandwidths of test and measurement instruments, such as digital oscilloscopes, can be limited by an analog to digital converter (ADC) used to digitize input signals. The useable bandwidth of an ADC can be limited to the lesser of the analog bandwidth or one half of a maximum sample rate of the ADC. Various techniques have been developed to digitize higher bandwidth signals with existing ADCs.

For example, synchronous time-interleaving can be used to achieve an effective higher sample rate. Multiple ADCs can sample an input signal offset in time within a single sample period. The digitized outputs can be combined together for an effectively multiplied sample rate. However, if the analog bandwidth of the ADCs become the limiting factor, a high bandwidth front end, such as a multi-way interleaved track and hold amplifier is needed to achieve a higher bandwidth.

Conventional track and hold amplifier-based time-interleaved systems cause the track and hold amplifier to be clocked at a sample rate similar to or slower than the ADC channel bandwidth so that the ADC will have sufficient time to settle to the held value. The ADC is synchronously clocked to the track and hold amplifier to digitally capture each held value. Such a limitation on the track and hold amplifier in turn limits the ADC sample rate. Moreover, to satisfy the Nyquist sampling theorem, the ADC sample rate is lowered to less than twice the bandwidth of the ADC channel. As a result, many time-interleaved ADC channels are needed to achieve the desired performance.

As the number of ADC channels increases, the overall cost and complexity of the system also increases. For instance, the front end chip must now drive more ADC channels, including additional ADC circuitry, clocking circuitry, or the like, to get the overall net sample rate up to a suitable value. The size and complexity of the chip also results in longer communication paths, and therefore, an increase in parasitic capacitance, electromagnetic noise, design difficulties, and so forth.

In another technique, sub-bands of an input signal can be downconverted to a frequency range that can be passed through a lower sample rate ADC. In other words, the wide input bandwidth can be split into multiple lower-bandwidth ADC channels. After digitization, the sub-bands can be digitally upconverted to the respective original frequency ranges and combined into a representation of the input signal. One significant disadvantage of this technique is the inherent noise penalty when digitizing an arbitrary input signal whose frequency content may be routed to only one ADC channel. The recombined output will contain signal energy from only one ADC, but noise energy from all ADCs, thereby degrading the Signal-to-Noise Ration (SNR).

Accordingly, a need remains for improved devices and methods for digitizing any frequency input signal by all ADC channels in an asynchronous time-interleaved architecture, thereby avoiding the noise penalty.

DETAILED DESCRIPTION

This disclosure describes embodiments of an ADC system for a test and measurement instrument using harmonic mixing.

Figure 1:
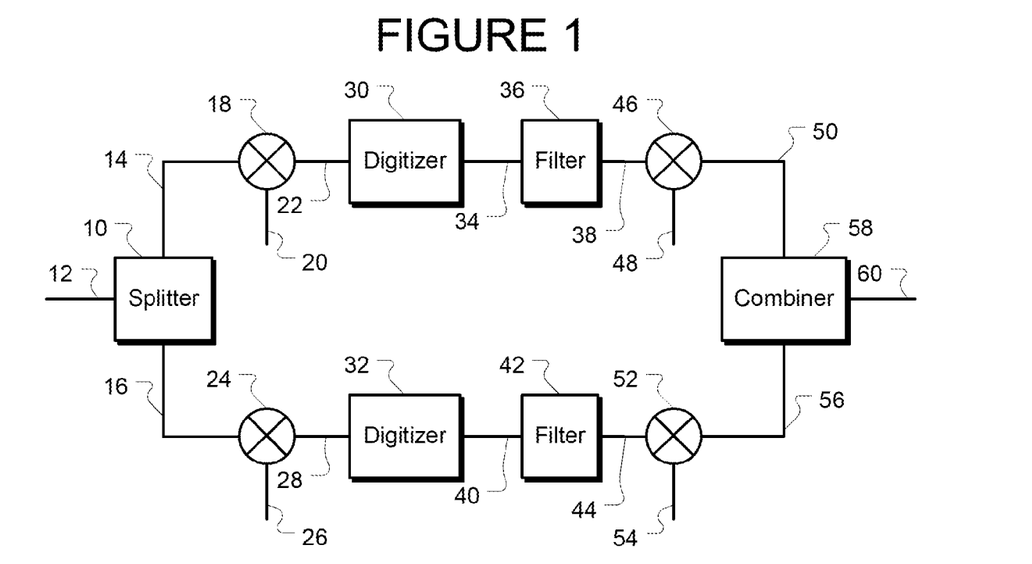
FIG. 1 is a block diagram of an ADC system for a test and measurement instrument using harmonic mixing according to an embodiment of the invention.

FIG. 1 is a block diagram of an ADC system for a test and measurement instrument using harmonic mixing according to an embodiment of the invention. In this embodiment, the instrument includes a splitter 10 configured to split an input signal 12 having a particular frequency spectrum into multiple split signals 14 and 16, each split signal including substantially the entire spectrum of the input signal 12. A splitter 10 can be any variety of circuitry that can split the input signal 12 into multiple signals. For example, the splitter 10 can be a resistive divider. Thus, substantially all frequency components of the input signal 12 can be present in each split signal 14 and 16. However, depending on the number of paths, harmonic signals used, or the like, the frequency responses for various split signals of a splitter 10 can be different.

The split signals 14 and 16 are inputs to harmonic mixers 18 and 24, respectively. Harmonic mixer 18 is configured to mix the split signal 14 with a harmonic signal 20 to generate a mixed signal 22. Similarly, harmonic mixer 24 is configured to mix the split signal 16 with a harmonic signal 26 to generate a mixed signal 28.

As used herein, a harmonic mixer is a device configured to mix a signal with multiple harmonics. Although multiplication and/or mixing has been described in connection with harmonic mixing, as will be described in further detail below, a device that has the effect of multiplying a signal with multiple harmonics can be used as a harmonic mixer.

In some embodiments, the multiple harmonics can include a zero-order harmonic, or a DC component. For example, in some embodiments, the harmonic signal 20 can be a signal represented by equation (1):

$$1 + 2\cos(2\pi F_1 t) \tag{1}$$

Here $F_1$ represents the first-order harmonic and t represents time. Thus, a signal having the form of equation (1) has harmonics at DC and at frequency $F_1$.

Harmonic signal 26 can be a signal represented by equation (2)

$$1 - 2\cos(2\pi F_1 t) \tag{2}$$

Similar to harmonic signal 20, harmonic signal 26 has harmonics at DC and frequency $F_1$. However, the first-order harmonic at frequency $F_1$ is out of phase by 180 degrees relative to the similar first-order harmonic in harmonic signal 20.

A digitizer 30 is configured to digitize mixed signal 22. Similarly, a digitizer 32 is configured to digitize mixed signal 28. The digitizers 30 and 32 can be any variety of digitizer. Although not illustrated, each digitizer 30 and 32 can have a preamplifier, filter, attenuator, and other analog circuitry as needed. Thus, the mixed signal 22 input to the digitizer 30, for example, can be amplified, attenuated, or otherwise filtered before digitization.

The digitizers 30 and 32 are configured to operate at an effective sample rate. In some embodiments, the digitizer 30 can include a single analog to digital converter (ADC). However, in other embodiments, the digitizer 30 can include multiple interleaved ADCs operating at lower sample rates to achieve a higher effective sample rate.

A first-order harmonic of at least one of the harmonic signals 20 and 26 is different from an effective sample rate of at least one of the digitizers 30 and 32. For example, the first-order harmonic $F_1$ of the harmonic signal 20 could be 34 GHz. A sample rate of the digitizer 30 could be 50 GS/s. Thus, the first-order harmonic $F_1$ is different from the effective sample rate.

In some embodiments, the first-order harmonic of a harmonic signal need not be an integer multiple or sub-multiple of the effective sample rate of the at least one of the digitizers. In other words, in some embodiments, the first-order harmonic of a harmonic signal associated with the harmonic mixers is not an integer multiple or sub-multiple of the effective sample rate of the at least one of the digitizers.

In some embodiments, the first-order harmonic of a harmonic signal can be between the effective sample rate of the at least one of the digitizers and one half of the effective sample rate of the at least one of the digitizers. In particular, as will be described in further detail below, such a frequency allows higher frequency components above and/or below the first-order harmonic to be mixed down in frequency to be below one half of the sample rate of the digitizer 30. Thus, such frequency components can be digitized effectively by the digitizer 30.

It should be understood that all bands of the input signal 12 go through all paths. In other words, when more than one channel is combined for processing a single input signal 12, each channel or path receives substantially the entire bandwidth of the input signal 12. As the input signal 12 is transmitted through all of the digitizers, the signal to noise ratio is significantly improved.

A filter 36 can be configured to filter the digitized mixed signal 34 from digitizer 30. Similarly, a filter 42 can be configured to filter the mixed signal 40 from digitizer 32. Harmonic mixers 46 and 52 are configured to mix the filtered mixed signals 38 and 44 with harmonic signals 48 and 54, respectively. In some embodiments, the harmonic signals 48 and 54 can be substantially similar in frequency and phase to the corresponding harmonic signals 20 and 26. While the harmonic signals 20 and 26 are analog signals, and the harmonic signals 48 and 54 are digital signals, the scaling factors for these harmonic signals can be the same or similar to each other. The output signals 50 and 56 are referred to as remixed signals 50 and 56. A combiner 58 is configured to combine the remixed signals 50 and 56 into a reconstructed input signal 60. In some embodiments, the combiner 58 can implement more than mere addition of signals. For example, averaging, filtering, scaling, or the like can be implemented in the combiner 58.

The filters 36 and 42, the harmonic mixers 46 and 52, harmonic signals 48 and 54, the combiner 58, and other associated elements can be implemented digitally. For example, a digital signal processor (DSP), microprocessor, programmable logic device, general purpose processor, or other processing system with appropriate peripheral devices as desired can be used to implement the functionality of the processing of the digitized signals. Any variation between complete integration to fully discrete components can be used to implement the functionality.

Some form of synchronization of the harmonic signals 20, 26, 48, and 54 is used. For example, the harmonics of the harmonic signals 20 and 26 can be locked to a clock related to the digitizers 30 and 32. In another example, the harmonic signal can be digitized. Thus, the first-order harmonic would be available to synchronize the harmonic signals 48 and 54. In another example, out-of-band tones can be added to one or more of the mixed signals 22 and 28. Using a first-order harmonic of 34 GHz, 19.125 GHz and 21.25 GHz tones, or $9/16$ and $10/16$ of 34 GHz, can be added to the mixed signal 22. Since these tones are outside of a bandwidth of the filtering eventually established by filter 36, i.e., approximately 18 GHz depending on the transition band, the tones can have a substantially negligible effect on the reconstructed signal 60. However, as the tones can be less than a Nyquist frequency, i.e. less than 25 GHz for a 50 GS/s sample rate, the tones can be acquired by using the digitized mixed signal 34 before filtering. Regardless of the technique used, a phase and frequency relationship between the harmonic signals 20 and 26 and the digital harmonic signals 48 and 54 can be maintained.

Figure 2:
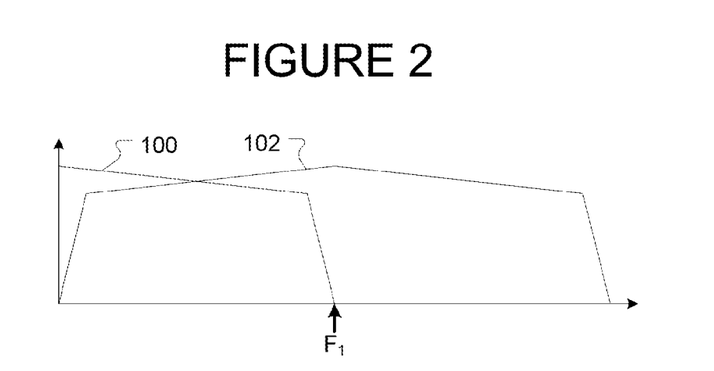
FIGS. 2-8 illustrate examples of spectral components of various signals in the ADC system for the test and measurement instrument of FIG. 1.

FIGS. 2-8 illustrate examples of spectral components of various signals in the ADC system for the test and measurement instrument of FIG. 1. Referring to FIGS. 1 and 2, spectrum 100 can be a spectrum of the input signal 12 and hence, the split signal 14. Using the above example of the harmonic signal defined in equation (1), a DC component of the split signal 14 is passed, as represented by spectrum 100. However, the spectrum 100 in the input signal 12 is also mixed with the first-order harmonic at frequency $F_1$. The resulting spectrum 102 is the product of such mixing. Thus, the mixed signal 22 includes components of spectrum 100 and spectrum 102. Here, and in other figures, the spectral components are illustrated as separate and overlapping however, the actual spectrum would be the combination of the spectra 100 and 102.

Figure 3:
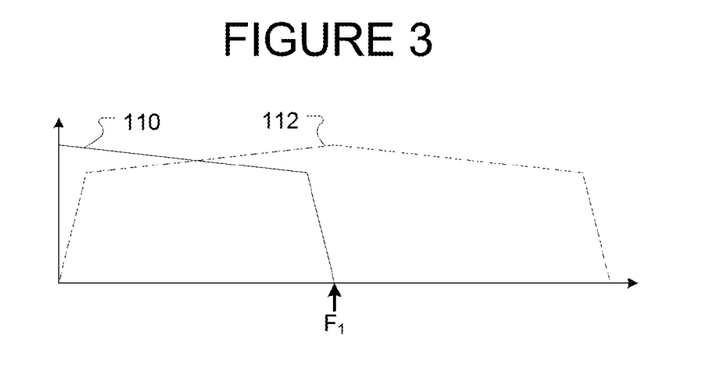

Referring to FIGS. 1 and 3, spectrum 110 similarly represents components of the mixed signal 28 due to the mixing of input signal 12 with the DC harmonic of the harmonic signal 26. However, in contrast to FIG. 2, the spectrum 112 has a 180 degree phase difference relative to the spectrum 102 of FIG. 2. As described above, the first-order harmonic of the harmonic signal 26 is phase shifted by 180 degrees from the first-order harmonic of the harmonic signal 20. This 180 degree phase shift in the harmonic signal 26 induces a 180 degree phase shift in the spectrum 112. The 180 degree phase difference is illustrated as a dashed line.

Figure 4:
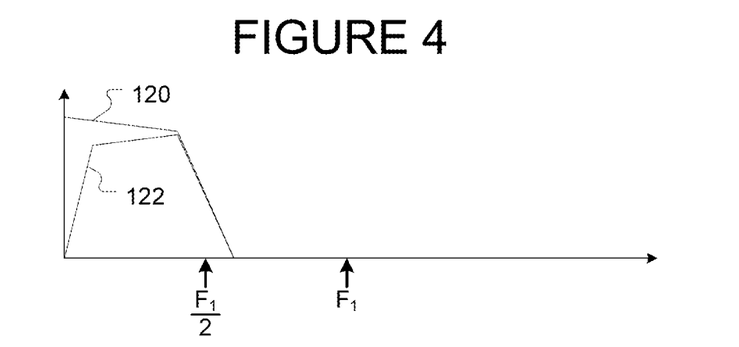
Figure 5:
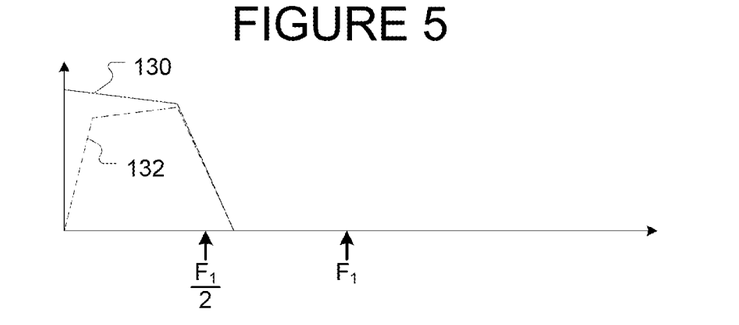

FIGS. 4 and 5 represent the spectrums of the filtered mixed signals 38 and 44. In some embodiments, the filtering can be a function of inherent filtering of the corresponding digitizers 30 and 32, the filters 36 and 42, or the like. Although filtering is illustrated in FIG. 1 as occurring after the digitizers 36 and 42, filtering can be performed in other locations. For example, some filtering can occur prior to digitization. The mixed signals 22 and 28 could be filtered with a low pass filter having a cutoff frequency near one half of the effective sample rate of the digitizers 30 and 32. The filtering of filters 36 and 42 can add to such inherent and/or induced filtering.

In some embodiments, the net filtering of the mixed signals 22 and 28 can result in a frequency response that is substantially complementary about one half of a frequency of the first-order harmonic of the harmonic signals 20 and 26. That is, the frequency response at a given offset higher than frequency $F_1/2$ and the frequency response at a given offset lower than frequency $F_1/2$ can add to one. Although one has been used as an example, other values can be used as desired, such as for scaling of signals. Furthermore, the above example is described as an ideal case. That is, the implemented filtering can have different response to account for non-ideal components, calibration, or the like.

In a particular example of the frequency response, using the 34 GHz $F_1$ described above, frequency $F_1/2$ can be 17 GHz. From DC to 16 GHz the frequency response can be one. From 16 to 18 GHz, the frequency response can linearly change from one to zero, passing through ½ at 17 GHz.

The resulting spectral components in FIG. 4, representing the filtered mixed signal 38 include a lower frequency portion of spectrum 100, illustrated by spectrum 120, and a lower frequency portion of spectrum 102, illustrated by spectrum 122. Note that due to the mixing, spectrum 122 includes frequency components of a higher sub-band of spectrum 100, albeit reversed in frequency. Similarly, the spectral components 130 and 132 of FIG. 5 correspond to the lower frequency components of spectra 110 and 112 of FIG. 3. The 180 degree phase relationship of spectrum 112 is preserved in spectrum 132.

Accordingly, through the harmonic mixing, two sub-bands of an input signal 12 have been digitized even though the span of the sub-bands would have exceeded a Nyquist bandwidth associated with the digitizers 30 and 32. In this embodiment, each mixed signal, whether analog, digital, filtered, or the like, includes components of each sub-band of the input signal 12. That is, in this example, each signal from the mixed signals 22 and 28 to the filtered digitized mixed signal 38 and 44 includes both a low frequency sub-band and a high frequency sub-band of spectrum 100.

In particular, the sub-bands of the input signal 12 have been frequency shifted to be within the bandwidth of a baseband sub-band. In some embodiments, each sub-band of the input signal 12 can be frequency shifted to be within the bandwidth of the single sub-band. However, depending on the number of sub-bands, and the harmonic signals, each sub-band may not be present in each mixed signal.

Figure 6:
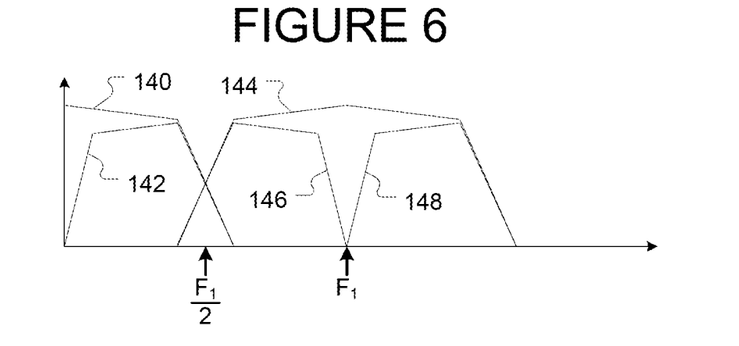
Figure 7:
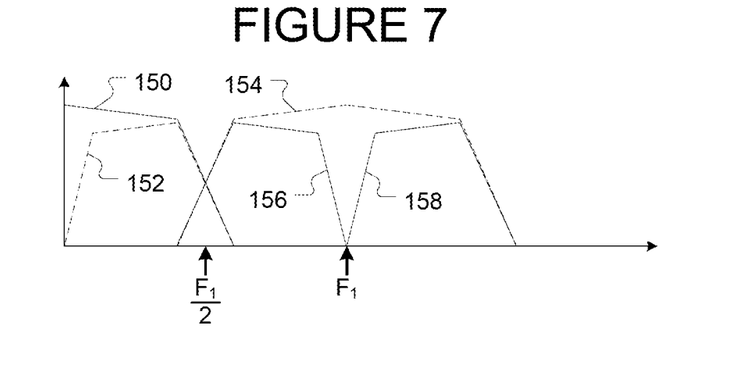

FIGS. 6 and 7 represent the spectra of the remixed signals 50 and 56. Referring to FIGS. 1 and 6, the spectrum represents the remixed signal 50. As described above the filtered digitized mixed signal 38 can be mixed in the harmonic mixer 46 with the harmonic signal 48 that is substantially similar in frequency and phase to the harmonic signal 20. Accordingly, the spectra of FIG. 4 are mixed with a DC component and a first-order harmonic.

Spectra 140 and 142 represent the spectra from mixing the spectra 120 and 122 of FIG. 4 with the DC component. Spectrum 144 represents the result of mixing the spectrum 120 with the first-order harmonic. Spectra 146 and 148 represent the mixing of spectrum 122 of FIG. 4 with the first-order harmonic.

Similarly, FIG. 7 represents the spectra of the remixed signal 56. Spectra 150 and 152 represent the mixing of the DC component with the spectra of FIG. 5. Spectrum 154 represents the mixing of the first-order harmonic of the harmonic signal 54 with the spectrum 130 of FIG. 5. In particular, as the first-order harmonic of harmonic signal 54 has a relative 180 degree phase shift, the resulting spectrum 154 also has a 180 degree phase shift, represented by the dashed line.

Spectrum 132 of FIG. 5 is also mixed with the first-order harmonic of harmonic signal 54; however, the spectrum 132 already had a 180 degree induced phase shift. Thus, the additional 180 degree phase shift results in an effective 0 degree phase shift, represented by the solid line of spectra 156 and 158.

Figure 8:
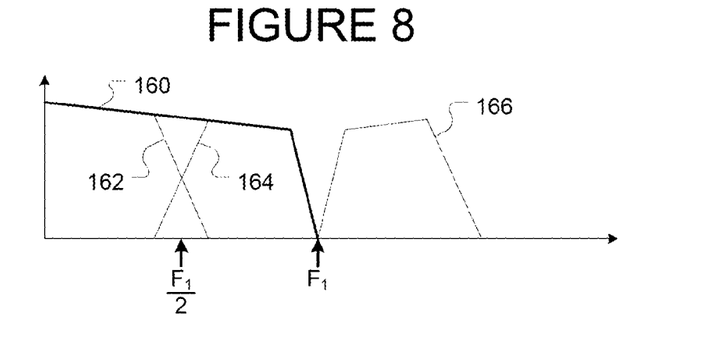

FIG. 8 illustrates a spectrum 160 of the reconstructed input signal 60 of FIG. 1. Spectra 162 and 164 represent the component sub-bands forming the spectrum 160. Spectrum 166 represents an additional sideband from the mixing described with respect to FIGS. 6 and 7. In this embodiment, spectrum 166 can be filtered out; however, in other embodiments sub-bands can extend beyond the first-order harmonic frequency $F_1$. In such an embodiment, spectrum 166, being generated from a lower frequency sub-band, can be eliminated through destructive combination.

Due to the relative phasing of the components of the remixed signals 50 and 56, sub-bands in their original frequency range combine constructively, while sub-bands outside of their original frequency range are phased to combine destructively. Referring to FIGS. 6-8, when combined, spectra 140 and 150 combine constructively, resulting in spectrum 162. Spectra 142 and 152 combine destructively as the spectra are out of phase by 180 degrees. Thus, of the spectra within the baseband sub-band, the remaining sub-band is the original sub-band.

Similarly, for the sub-band from approximately $F_1/2$ to $F_1$, spectra 146 and 156 combine constructively into spectrum 164, while spectra 144 and 154 combine destructively. Spectra 148 and 158 combine constructively into spectrum 166; however, spectrum 166 can be filtered out as it is beyond the expected input frequency range which in this case is about less than frequency $F_1$.

As illustrated by spectra 162 and 164, a transition occurs around frequency $F_1/2$. This transition is the result of the filtering described above in reference to FIGS. 4 and 5. In particular, the slopes of spectrum 162 and spectrum 164 are complementary. Thus, when the frequency components of the spectrums 162 and 164 are combined, the resulting portion of the spectrum 160 substantially matches the original frequency spectrum.

Accordingly, by mixing the input signal 12 with various harmonic signals, sub-bands of the input signal 12 can be passed through the lower bandwidth of a digitizer. Although the mixed signals included overlapping sub-bands, because of the phasing of the harmonic signals, the sub-bands combine constructively and destructively when combined as described above to create a substantially accurate representation of the input signal 12.

FIGS. 9-12 are block diagrams of examples of harmonic mixers of FIG. 1. In some embodiments, a mixer can be used to mix the split signals 14 and 16 with the respective harmonic signals 20 and 26. A mixer that can pass DC and baseband signals on all ports can be used as a harmonic mixer.

Figure 9A:
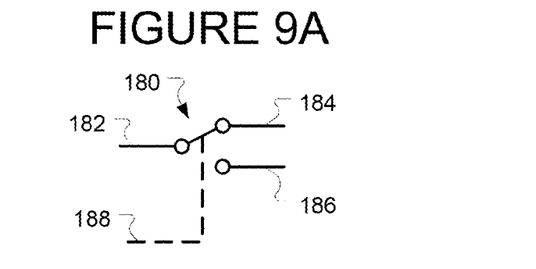
FIGS. 9A, 9B and 10-12 are block diagrams of examples of harmonic mixers of FIG. 1.
Figure 9B:
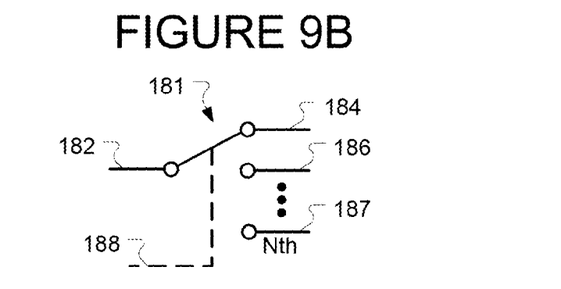

FIGS. 9A and 9B illustrate examples of a harmonic mixer, which can represent any one or more of the harmonic mixers 18, 24, 46, and/or 52 discussed above. FIG. 9A illustrates a 2-way time-interleaving switch. FIG. 9B illustrates an N-way time-interleaving switch.

In these embodiments, switches 180 and/or 181 are configured to receive an input signal 182. When using the 2-way switch 180, the input signal 182 is switched to outputs 184 and 186 in response to a control signal 188. When using the N-way switch 181, the input signal 182 is switched to the outputs 184, 186, on through to the Nth output 187, in response to the control signal 188. For example, the switch 181 can be a three-throw switch, a four-throw switch, etc., up to an N-throw switch, which causes the input signal 182 to spend 1/Nth of its time at each point or output. As further paths and sub-bands are added, the harmonics of the harmonic signals can be appropriately phased. In some embodiments, the relative phase shifts of the harmonic signals can be spaced in phase by time shifts of one period divided by the number of sub-bands.

As the pulses get shorter compared to the overall clock cycle, the harmonic content gets richer. For instance, for a two-way or a three-way switch, the zero-order harmonic (DC) and the first-order harmonic are used. For a four-way or five-way switch, the zero-order harmonic, the first-order harmonic, and a second-order harmonic can be used. For a six-way or seven-way switch, the zero-order harmonic, the first-order harmonic, a second-order harmonic, and a third-order harmonic can be used. As N increases, the pulses get narrower, thereby generating the richer harmonic content. The control signal 188 can be a signal having a fundamental frequency of the first-order harmonic, or other suitable harmonic frequency, described above.

All bands of the input signal 182 go through all paths, i.e., to each of the outputs paths (e.g., 184, 186, through the Nth output 187).

For example, referring to switch 180, the control signal 188 can be a square wave with a fundamental frequency of 34 GHz. As a result of the switching, output 184 will receive the input signal 182 during one half-cycle of the control signal and will be approximately zero during the opposite half-cycle. In effect, the output 184 is the input signal 182 multiplied by a square wave oscillating between zero and one at 34 GHz. Such a square wave can be represented by equation (3).

$$0.5 + \frac{2}{\pi}\sin(2\pi F_1 t) + \frac{2}{3\pi}\sin(6\pi F_1 t) + \ldots \quad (3)$$

Equation (3) is the Taylor series expansion of such a square wave. The DC and first two harmonics are listed. Here $F_1$ is 34 GHz. Although the magnitudes of the components are different, equations (1) and (3) include similar harmonics.

Output 186 is similar to output 184; however, the time period over which the input signal 182 is routed to the output 186 is inverted relative to output 184. The effect is again similar to multiplying the input signal 182 with a square wave defined by equation (4).

$$0.5 - \frac{2}{\pi}\sin(2\pi F_1 t) - \frac{2}{3\pi}\sin(6\pi F_1 t) + \ldots \quad (4)$$

Similar to equation (3), equation (4) is similar to the harmonic signal described in equation (2) above. Thus, the multiplication effect of the switching of the switch 180 is substantially similar to the mixing of a split signal with the harmonic signal described above. In addition, in this example, the switch can act as both the splitter 10 and harmonic mixers 18 and 24. However, in other embodiments, the switch 180 could be a single pole single throw switch and act as a single harmonic mixer.

Although the relative magnitudes of the DC component and the first-order harmonic are different, such imbalance can be corrected through a compensation filter in the appropriate path. For example, the sub-band described above between frequency $F_1/2$ and frequency $F_1$ can have a different gain applied during recombination in the combiner 58 than a baseband sub-band.

In addition, equations (3) and (4) above also list third-order harmonics. In some embodiments, the third-order harmonics may be desired. However, if not, the effect of such harmonics can be compensated with appropriate filtering. For example, the input signal 12 can be filtered to remove frequency components above frequency $F_1$. Thus, such frequency components would not be present to mix with a frequency at $3*F_1$. Moreover, filtering before a digitizer can remove any higher order frequency components that may otherwise affect the digitized signal due to aliasing.

In the event of interleaving errors due to analog mismatch, hardware adjustments can be made for mixing clock amplitude and phase. The adjustments can then be calibrated to minimize interleave mismatch spurs. Alternatively, or in addition to the above approach, hardware mismatches can be characterized, and a linear, time-varying correction filter can be used to cancel the interleave spurs. Further, in some cases, the switches might not always operate perfectly. For example, an errant switch might spend more time in one direction than the other, thereby causing a skewed duty cycle. The digital harmonic mixers 46 and 52 can be configured to compensate for phase or amplitude errors that may be present in the analog harmonic signals 20 and/or 26 by making subtle adjustments to the amplitude or phase of the digital harmonic signals 48 and/or 54.

Figure 10:
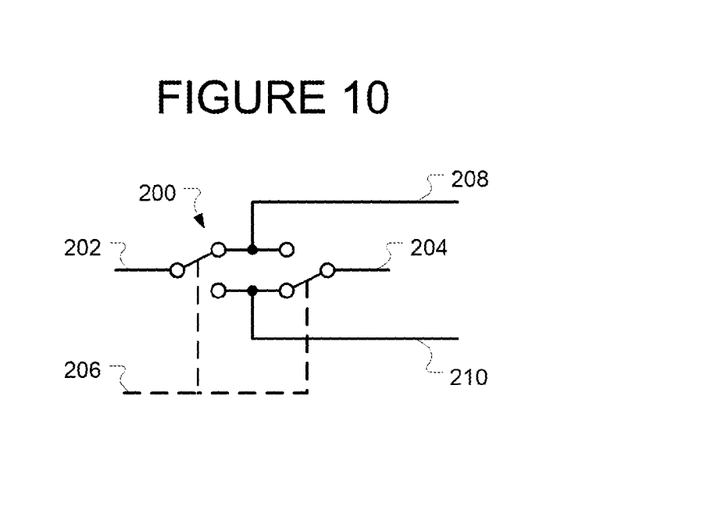

FIG. 10 is an example of another harmonic mixer. A switching circuit 200 is configured to switch two input signals 202 and 204 alternatively to outputs 208 and 210 in response to the control signal 206. The control signal 206 can again be a square wave or other similar signal to enable the switches of the switching circuit 200 to switch. During one half-cycle of the control signal 206, input signal 202 is switched to output 208 while input signal 204 is switched to output 210. During the other half-cycle, the input signal 202 is switched to output 210 while input signal 204 is switched to output 208.

In some embodiments, the input signal 204 can be an inverted and scaled version of the input signal 202. The result of such inputs and the switching described above is a rebalancing of the DC and other harmonics from the levels described above with respect to the switch 180 of FIG. 9A. For example, input signal 204 can be a fractional inverted version of the inputs signal 202. Instead of switching between 1 and 0 with the switch 180 of FIG. 9A, the effective output of outputs 208 and 210 can be switching between 1 and $(2-\pi)/(2+\pi)$, for example. Thus, the amplitude and DC level can be adjusted as desired to create the desired balance between the harmonics.

Figure 11:
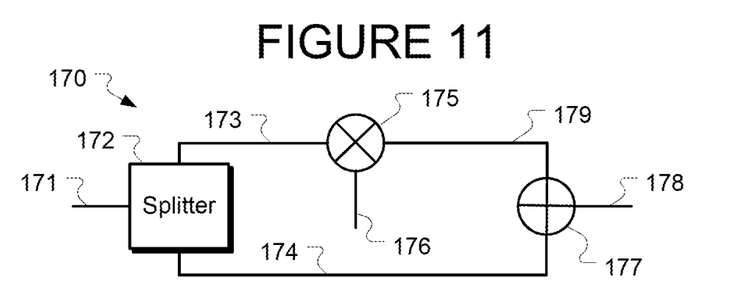

FIG. 11 illustrates an alternative example of a harmonic mixer. The harmonic mixer 170 includes a splitter 172, a mixer 175, and a combiner 177. The splitter 172 is configured to split an input signal 171 into signals 173 and 174. Signal 174 is input to the combiner 177. As signal 174 is not mixed with another signal, signal 174 can act as the DC component of a harmonic mixer described above.

Signal 173 is input to the mixer 175. A signal 176 is mixed with the signal 173. In some embodiments, signal 176 can be a single harmonic, such as the frequency $F_1$ described above. If additional harmonics are desired, additional mixers can be provided and the respective outputs combined in combiner 177.

In another embodiment, the signal 176 can include multiple harmonics. As long as the bandwidth of the ports of the mixer 175 can accommodate the desired frequency ranges, a single mixer 175 can be used. However, since the DC component of the harmonic signals described above is passed to the combiner 177 by a different path, the ports of the mixer receiving signals 173 and 176 need not operate to DC. Accordingly, a wider variety of mixers may be used. Once the signals 179 and 174 are combined in the combiner 177, the output signal 178 can be substantially similar to a mixed signal described above.

In some embodiments, the splitter 172 can, but need not split the input signal 171 symmetrically. For example, a side of the splitter that outputs signal 174 may have a bandwidth that is at or above the filtering cutoff frequency described above. A side of the splitter 172 that outputs signal 173 can have a frequency range centered on a harmonic of the signal 176 and a bandwidth of twice or greater of the filtering cutoff frequency described above. In other words, the frequency response of the splitter 172 need not be equal for each path and can be tailored as desired.

Figure 12:
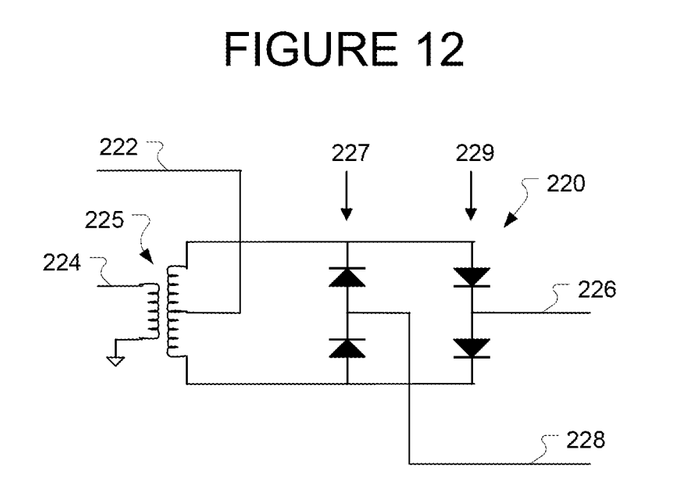

FIG. 12 is another example of a harmonic mixer of the general topology of FIG. 9A. In this embodiment, a harmonic signal 224 can be input to a diode ring 220 similar to a mixer through transformer 225. The input signal 222 can be input to a tap of the transformer 225. Accordingly, depending on the harmonic signal 224, the input signal 222 can be switched between outputs 226 and 228. For example, the harmonic signal 224 causes either the left diodes 227 to turn on when the bottom of the transformer is positive and the top is negative, or the right diodes 229 to turn on when the polarity of the transformer is reversed. In this manner, the input signal 222 is alternately routed to the output 228 and the output 226. In some embodiments, an additional diode ring could be used to terminate the outputs and/or inject an inverted portion of a sub-band of the input signal 222 to achieve a higher gain, compensate for imbalanced harmonics, or the like, as in the topology of FIG. 10.

In some embodiments, two paths and two overlapping sub-bands are implemented. However, as mentioned above, any number of paths and sub-bands can be used. In such embodiments, the number of harmonics used can be equal to one plus one half of a number of sub-bands, rounded down, where DC is included as a zero-order harmonic. For example, for three sub-bands, only two harmonics can be used. Using the above frequency ranges as an example, the first-order harmonic can frequency shift frequencies higher than frequency $F_1$ to the baseband sub-band. The first-order harmonics of the harmonic signals can be phased with 120 degree relative phase shifts.

Accordingly, when a sub-band is in the proper frequency range during combination in the combiner 58, the sub-band spectra will have the same phase shift, such as a 0 degree relative phase shift. In contrast, the three components of a sub-band in the incorrect frequency range would offset in phase from one another by 120 degrees. The resulting spectra would destructively combine to eliminate the incorrect sub-band. As further paths and sub-bands are added, the harmonics of the harmonic signals can be appropriately phased. In some embodiments, the relative phase shifts of the harmonic signals can be spaced in phase by time shifts of one period divided by the number of sub-bands.

Although embodiments have been described above where digitized signals can be substantially immediately processed, such processing after digitization can be deferred as desired. For example, the digitized data from digitizers 30 and 32 can be stored in a memory for subsequent processing.

The harmonic mixer 170 of FIG. 11 can be implemented with a hardware configuration that allows for the operation from DC to very wide bandwidth using off the shelf components.

Figure 13:
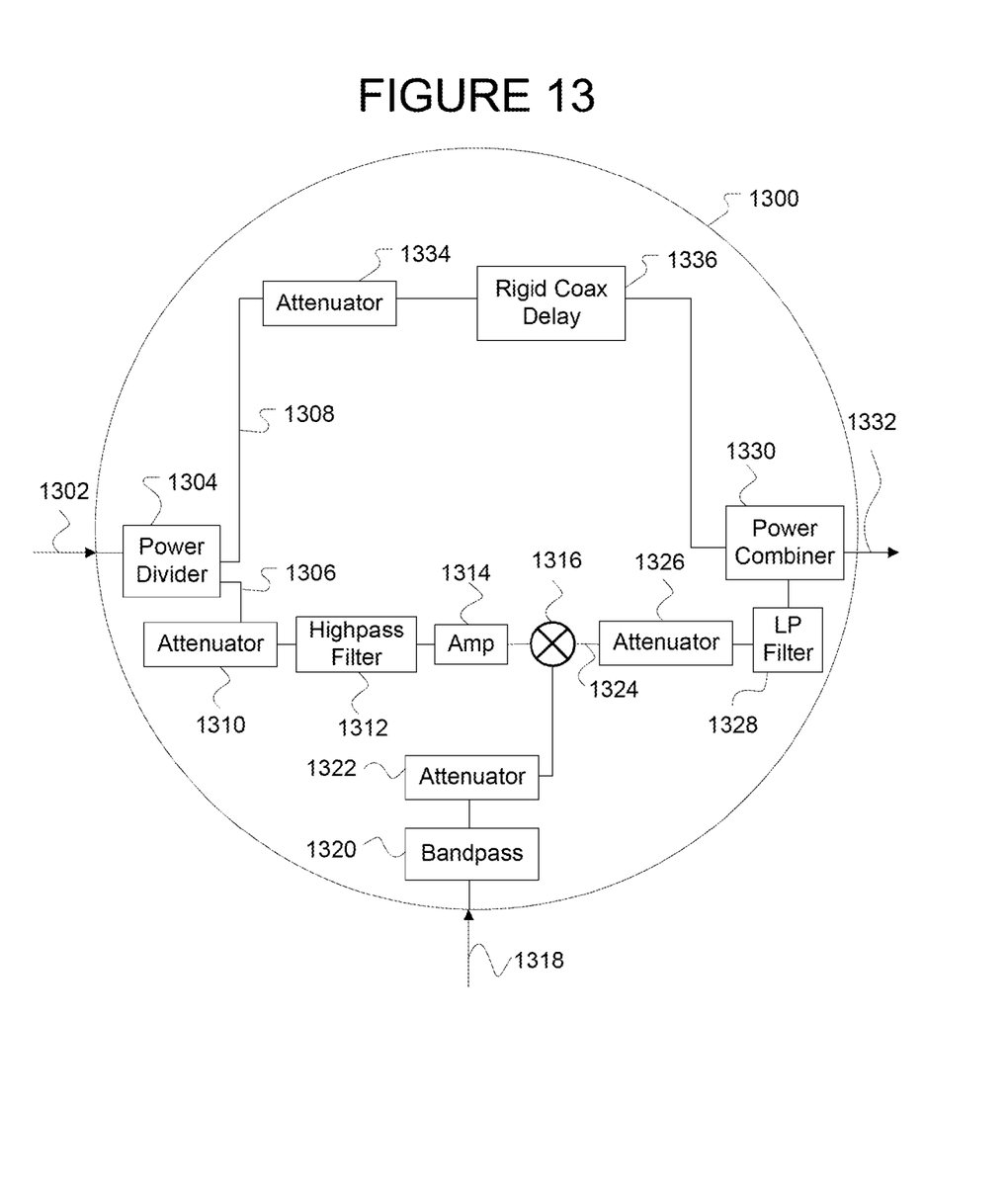
FIG. 13 is a block diagram of an embodiment of the harmonic mixer of FIG. 11.

FIG. 13 shows one embodiment of the harmonic mixer 170 of FIG. 11 using off the shelf components. Harmonic mixer 1300 shown in FIG. 13 is a DC to wide bandwidth harmonic mixer. Harmonic mixer 1300 receives an input signal 1302. The input signal 1302 is then split in a power divider, or splitter, 1304 into a first signal on a first path 1306 and a second signal on a second path 1308. Each path 1306 and 1308 includes all of the frequencies, including DC, that were present in the input signal 1302. As described in further detail below, the power divider 1304 may divide the input signal 1302 into more than two paths.

The first path 1306, also called a frequency translation path, includes a plurality of off-the-shelf components. For example, as seen in FIG. 13, the first signal on the first path 1306 travels through an attenuator 1310, a highpass filter 1312, an amplifier 1314, before being mixed at a mixer 1316. Attenuator 1310 may be, for example, a −3 dB attenuator. Attenuator 1310 provides input isolation and help with impedance matching over the low band input to highpass filter 1312. Highpass filter 1312 prevents the high band that is mixed down to the low band from traveling in a reverse direction in the thru path, and appearing at the input of the mixer 1316. Amplifier 1314 increases the amplitude of the first signal prior to being applied to the mixer 1316. The amplifier 1314 needs to only operate over the rage of ½ the minimum local oscillator (LO) frequency, not counting DC, up to the maximum frequency the design is intended to pass.

Mixer 1316 also receives a harmonic signal 1318 from an LO (not shown). The harmonic signal travels through a bandpass filter 3120 to prevent other harmonics, such as from a frequency multiplier circuit, from entering the mixer 1316. This may be a multiband filter so as to only pass each of the desired input harmonics and nothing else. The harmonic signal 1318 also passes through a −3 dB attenuator 1322 to provide isolation and help with impedance matching for LO harmonics applied to the LO input of the mixer in the first path 1306.

The harmonic signal 1318 from the attenuator 1322 is mixed with the first signal on the first path 1306 in the mixer 1316. The mixer 1316 outputs a mixed signal 1324 which passes through another −3 dB attenuator 1326 and a lowpass filter 1328 before being input to a combiner 1330. The lowpass filter 1328 has a bandwidth greater than or equal to ½ the lowest LO frequency to be used. Lowpass filter 1328 prevents LO harmonics that feed through the mixer 1316 from appear in the final output 1332 of the overall harmonic mixer 1300.

In the second path 1308, also called the 1.0 thru path, the second signal passes through a −6 dB attenuator 1334 and a rigid coax delay 1336. The attenuator 1334 helps keep the attenuation consistent between the second path 1308 and the first path 1306. The rigid coax delay 1336 passes the second signal on the second path 1308 to the power combiner 1330. The rigid coax delay 1336 also provides for a correct delay to allow the second signal on the second path 1308 to arrive at the combiner at the same time as the first signal on the first path 1306.

Power combiner 1330 in this embodiment is a two-way power combiner. The power combiner 1330 combines the output from the rigid coax delay 1336 on the second path 1308 with the output from the lowpass filter 1328 on the first path 1306 and outputs an output signal 1332. The power combiner 1330 covers a bandwidth from DC to ½ the sample rate of the digitizers. As discussed in more detail below, the power combiner may also be an M-way combiner, where M is the number of paths used within the harmonic mixer.

Figure 14:
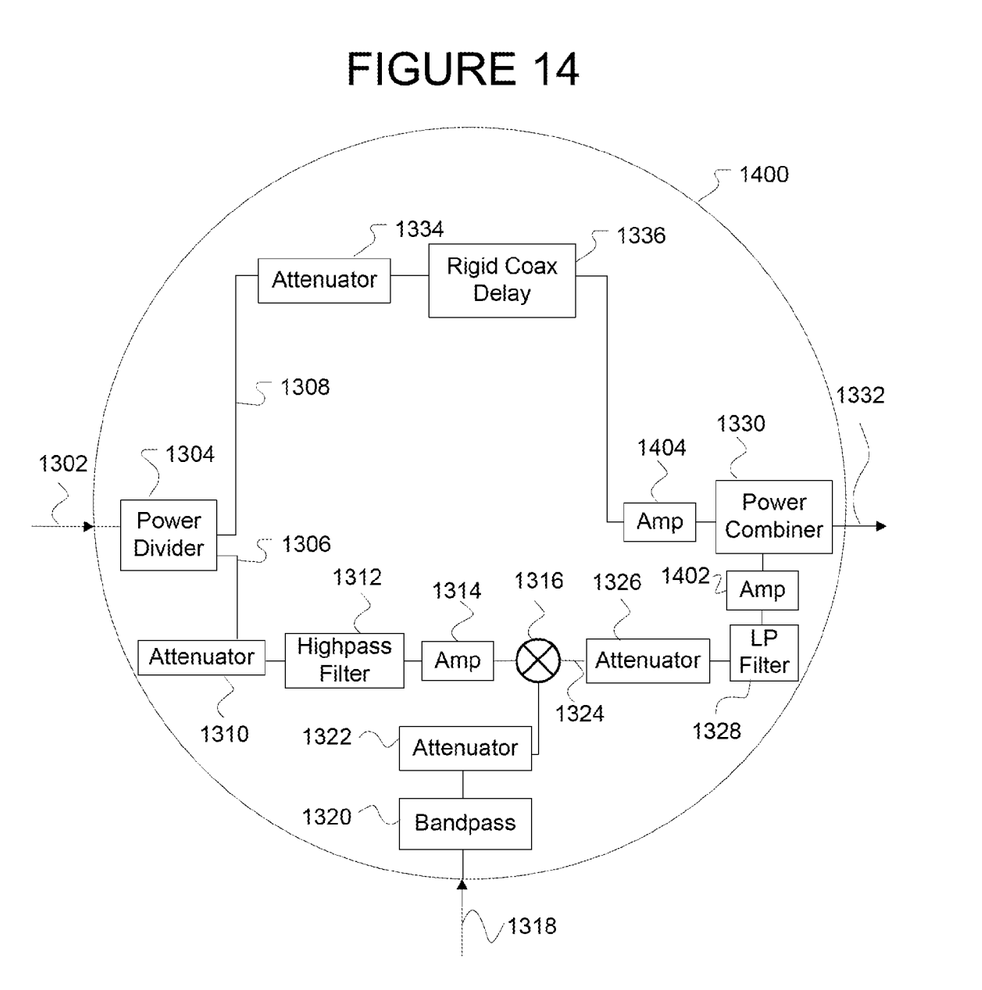
FIG. 14 is a block diagram of an alternative embodiment of the harmonic mixer of FIG. 11.

FIG. 14 shows an alternative embodiment for a harmonic mixer. The embodiment shown in FIG. 14 is similar to that shown in FIG. 13 except the harmonic mixer 1400 now includes two amplifiers 1402 and 1404 to buffer the first signal on the first path 1306 and the second signal on the second path 1308. Amplifiers 1402 and 1404 on the first path 1306 and the second path 1308, respectively, increases the system gain to be zero, such that an input signal of 0 dBm will result in an output signal that is close to 0 dBm. The amplifiers 1402 and 1404 also buffer the signals from passing in the reverse direction thru the power combiner 1330.

Figure 15:
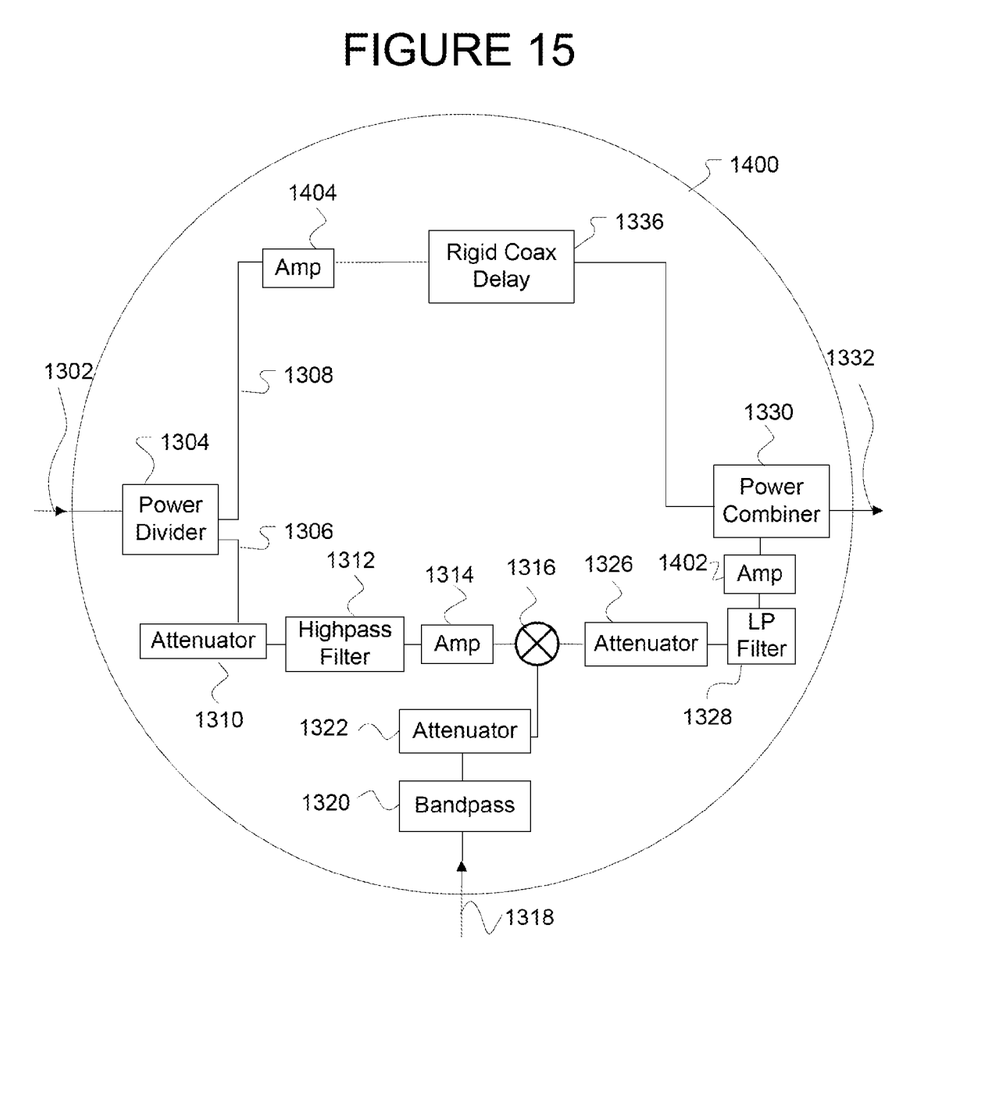
FIG. 15 is a block diagram of another alternative embodiment of the harmonic mixer of FIG. 11.

FIG. 15 shows yet another embodiment of a harmonic mixer. In this configuration, amplifier 1404 has been moved to replace the attenuator 1334.

Figure 16:
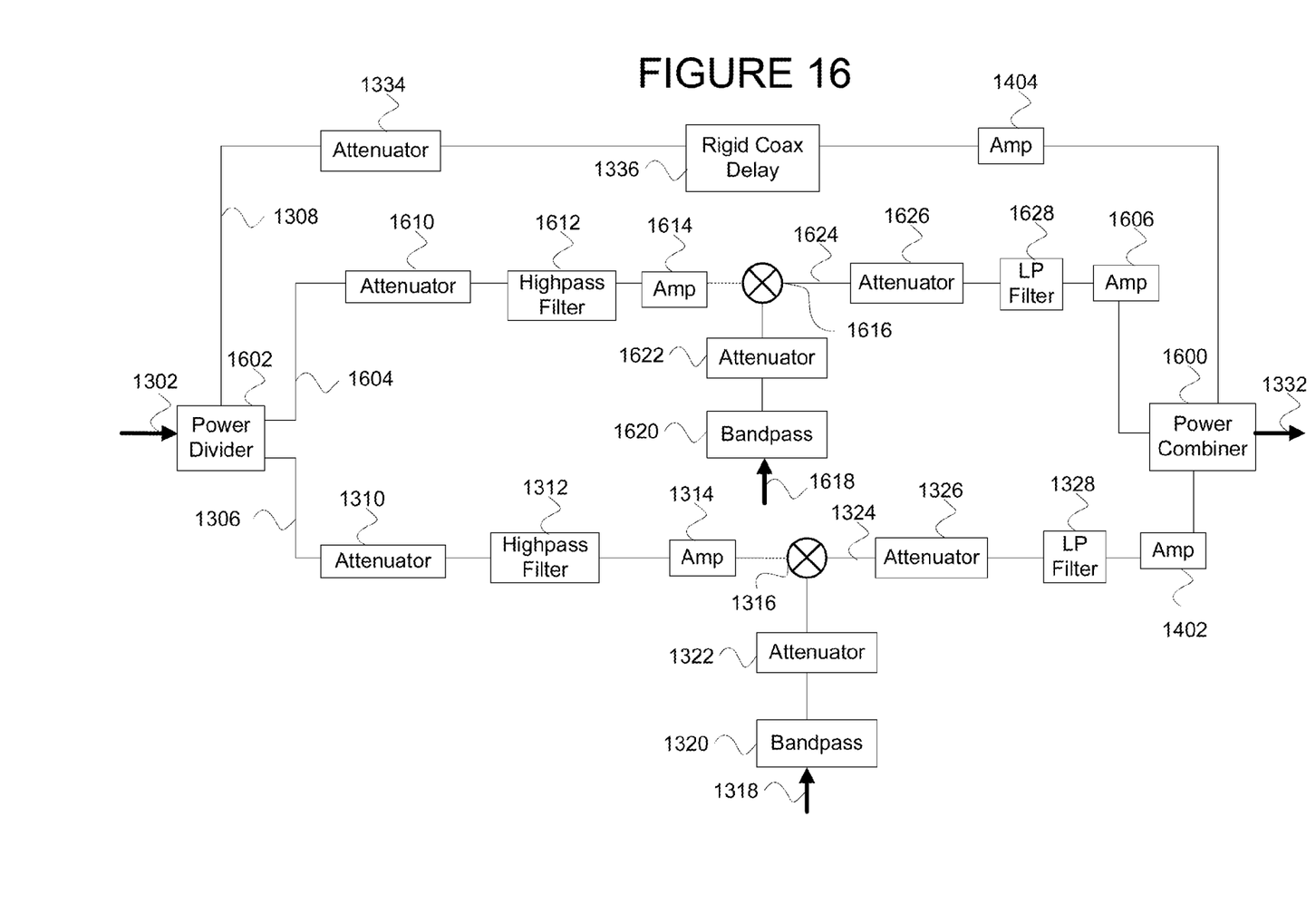
FIG. 16 is a block diagram of an alternative harmonic mixer.

FIG. 16 illustrates an embodiment with a three-way power combiner 1600. In this embodiment, power divider 1602 splits the input signal 1302 into three signals, the first signal on the first path 1306, the second signal on the second path 1308 and a third signal on the third path 1604. The first and second paths 1306 and 1308 are identical to those shown in FIG. 14. Accordingly, these paths are not further discussed with respect to FIG. 16.

The third path 1604 is identical to the first path 1306, and is also called a second frequency translation path. However, the harmonic signal 1618 is different than the harmonic signal 1318. Additional frequency translation paths may be added to the harmonic mixer 1300 as desired.

The third path 1604 includes all of the components of the first path 1306. That is, the third path 1604 includes attenuator 1610, highpass filter 1612, amplifier 1614, mixer 1616, harmonic signal 1618, a bandpass filter 1620, another attenuator 1622, a mixed signal 1624, a third attenuator 1626, a lowpass filter 1628 and a second amplifier 1606.

The ouput signals in FIGS. 13-16 can be calculated using the following formulae. The output signal of the mixer equals the input signal times the local oscillator as shown in equation (5)

$$IF = RF \cdot LO, \text{ where } IF \text{ is the output signal, } RF \text{ is in the input signal.} \quad (5)$$

Equation (5) can be rewritten with the frequencies of the LO as shown in equation (6):

$$IF = RF \cdot (1.0 + H_1 + H_2 + \ldots H_M) \quad (6)$$

M in equation 6 is the highest number harmonic needed for a multi-way interleave configuration.

$H_1$, $H_2$, and $H_M$ can be written in terms of the first-order mixing frequency $F_1$ as shown in equations (7), (8), and (9):

$$H_1 = 2 \cdot \cos(2 \cdot \pi \cdot F_1 \cdot t) \quad (7)$$

$$H_2 = 2 \cdot \cos(4 \cdot \pi \cdot F_1 \cdot t) \quad (8)$$

$$H_M = 2 \cdot \cos(2M \cdot \pi \cdot F_1 \cdot t) \quad (9)$$

The embodiments of FIGS. 13-16 use a standard triple balanced mixer that does not operate to DC. However, the 1.0 term in the LO input harmonic set when multiplied by the input signal passes the input signal directly thru the mixer without frequency translation. Thus, the 1.0 term is implemented using the power divider, or splitter, 1302 at the input and the power combiner 1330 at the output. Therefore, this term is applied at the input although it is not physically present at the input. The input signal passes directly thru the harmonic mixer.

The $H_1$ and $H_2$, and higher harmonics, are fed as the harmonic signals 1318 and 1618. These terms perform the frequency translation which aliases multiple bands down to the baseband. Thus, these bands are overlaid on each other and cover a range of DC up to as much as ½ the same rate of the digitizers that the harmonic mixer outputs will be feed into.

While the LO input and input signal to the mixers 1316 and 1616 do not need to operate to DC, the output of the harmonic mixer does need to operate to DC for 3-way, 4-way, and higher interleave factors. The output, however, does not need to operate to DC for the 2-way interleave designs. The harmonic mixer of FIGS. 13-16 operate from DC to the highest frequency desired at the input signal. The LO input including the implied 1.0 term, must operate over essentially the same range. The output must operate from DC up to as much as ½ of the sample rate of the digitizer the mixer will be fed to.

Additional frequency translation paths can be added, as shown in FIG. 16 discussed above. The addition of the frequency translation paths allow for wider bandwidth implementation by using multiple mixers. Each mixer, for example, mixers 1316 and 1616 in FIG. 16, cover a different portion of the input signal spectrum. One mixer and amplifier of FIG. 16 needs only operate over the input spectrum range 25 GHz to 50 GHz. The mixer and amplifier for the other path must operate over the 50 GHz to 75 GHz range. These mixers can be found in the market place, whereas a mixer that operates from 25 GHz to 100 GHz cannot be found. A fourth path, or third translation path, can be added (not shown) to cover the range of 75 GHz to 100 GHz. The path would have the same configuration at the first path 1305 and the third path 1604 as discussed above.

The harmonic mixers in FIGS. 13-16 can also be used in harmonic time interleave (HTI) systems, rather than the asynchronous time-interleaved systems discussed above. In fact, the harmonic mixers of FIGS. 13-16 can be used in any system that requires operating from DC to a very high bandwidth.

Although particular values have been discussed with respect to FIGS. 13-16, the values are shown as examples. Particular gains and losses can be adjusted based on available parts, cost trade-offs, etc. Likewise, the bandwidth values can be adapted to meet a market need.

Moreover, although the digital filtering, mixing, and combining have been described as discrete operations, such operations can be combined, incorporated into other functions, or the like. In addition, as the above discussion assumed ideal components, additional compensation, can be introduced into such processing as appropriate to correct for non-ideal components. Furthermore, when processing the digitized signals, changing frequency ranges, mixing, and the like can result in a higher sample rate to represent such changes. The digitized signals can be upsampled, interpolated, or the like as appropriate.

Another embodiment includes computer readable code embodied on a computer readable medium that when executed, causes the computer to perform any of the above-described operations. As used here, a computer is any device that can execute code. Microprocessors, programmable logic devices, multiprocessor systems, digital signal processors, personal computers, or the like are all examples of such a computer. In some embodiments, the computer readable medium can be a tangible computer readable medium that is configured to store the computer readable code in a non-transitory manner.

Although particular embodiments have been described, it will be appreciated that the principles of the invention are not limited to those embodiments. Variations and modifications may be made without departing from the principles of the invention as set forth in the following claims.

What is claimed is:

1. A harmonic mixer, comprising:
   an input signal splitter configured to split an input signal into a first signal on a first path and a second signal on a second path;
   a mixer configured to mix the first signal and a harmonic signal and to generate a mixed signal on the first path; and
   a combiner configured to combine the second signal from the second path and the mixed signal from the first path and to generate an output signal;

wherein the mixed signal is a first mixed signal and the harmonic signal is a first harmonic signal,
the input signal splitter is further configured to split the input signal into the first signal, the second signal, and a third signal on a third path,
the harmonic mixer further comprises a second mixer configured to mix the third signal and a second harmonic signal different from the first harmonic signal and to generate a second mixed signal on the third path, and
the combiner is further configured to combine the second signal, the first mixed signal, and the second mixed signal.

2. The harmonic mixer of claim 1, wherein the third path includes:
a first attenuator to receive the third signal;
a highpass filter to receive the third signal from the attenuator;
a first amplifier to receive the signal from the highpass filter;
a second attenuator to receive the second mixed signal from the second mixer;
a lowpass filter; and
a second amplifier to receive the second mixed signal from the lowpass filter and output the second mixed signal to the combiner.

3. The harmonic mixer of claim 2, wherein the second harmonic signal passes through a bandpass filter and an attenuator before being mixed with the third signal.

4. The harmonic mixer of claim 1, wherein the harmonic signal is a first harmonic signal, and the mixer is further configured to mix the first signal, the first harmonic signal, and a second harmonic signal different than the first harmonic signal.

5. The harmonic mixer of claim 1, wherein the input signal is not split symmetrically by the input signal splitter.

6. The harmonic mixer of claim 1, wherein the harmonic signal passes through a bandpass filter and an attenuator before being mixed with the first signal.

7. A harmonic mixer, comprising:
an input signal splitter configured to split an input signal into a first signal on a first path and a second signal on a second path;
a mixer configured to mix the first signal and a harmonic signal and to generate a mixed signal on the first path; and
a combiner configured to combine the second signal from the second path and the mixed signal from the first path and to generate an output signal, wherein the first path includes:
a first attenuator to receive the first signal;
a highpass filter to receive the first signal from the attenuator;
a first amplifier to receive the signal from the highpass filter;
a second attenuator to receive the mixed signal from the mixer; and
a lowpass filter to output the mixed signal to the combiner.

8. The harmonic mixer of claim 7, wherein the second path includes:
a third attenuator, and
a rigid coax delay, wherein the second signal passed through the third attenuator and the rigid coax delay before being combined in the combiner.

9. The harmonic mixer of claim 7, wherein the first path further includes a second amplifier between the lowpass filter and the combiner.

10. The harmonic mixer of claim 7, where the second path includes:
a third amplifier, and
a rigid coax delay, wherein the second signal passed through the third amplifier and the rigid coax delay before being combined in the combiner.

11. The harmonic mixer of claim 10, wherein the second path further includes a fourth amplifier between the rigid coax delay and the combiner.

12. A method, comprising:
splitting an input signal into a first signal on a first path and a second signal on a second path;
mixing the first signal and a harmonic signal and generating a mixed signal on the first path; and
combining the second signal from the second path and the mixed signal from the first path and generating an output signal;
wherein the mixed signal is a first mixed signal and the harmonic signal is a first harmonic signal, the method further including:
splitting the input signal into the first signal, the second signal, and a third signal on a third path,
mixing the third signal and a second harmonic signal different from the first harmonic signal and generating a second mixed signal on the third path, and
combining the second signal, the first mixed signal, and the second mixed signal.

13. The method of claim 12, wherein the harmonic signal is a first harmonic signal, and the method further includes mixing on the first path the first signal, the first harmonic signal, and a second harmonic signal different than the first harmonic signal.

* * * * *